US006646671B1

United States Patent
Jitramas et al.

(10) Patent No.: US 6,646,671 B1
(45) Date of Patent: Nov. 11, 2003

(54) METHOD AND SYSTEM FOR SYNCHRONIZING LEAD SCANNERS AND LASER MARKER MODULES

(75) Inventors: Naramitr Jitramas, Bangkok (TH); Somboon Sritulanont, Nonthaburi (TH); Surasee Chantaphan, Bangkok (TH); Watcharin Namkang, Ratburana Bangkok (TH)

(73) Assignee: Advanced Micro Devices, Inc., Sunnyvale, CA (US)

( * ) Notice: Subject to any disclaimer, the term of this patent is extended or adjusted under 35 U.S.C. 154(b) by 95 days.

(21) Appl. No.: 10/032,635

(22) Filed: Dec. 27, 2001

(51) Int. Cl.[7] .................................................. B41J 2/435
(52) U.S. Cl. ....................................................... 347/247
(58) Field of Search ............................ 438/14; 347/247; 235/454

(56) References Cited

U.S. PATENT DOCUMENTS 6,061,081 A * 5/2000 Hasebe et al. ............... 347/247
6,415,977 B1 * 7/2002 Rumsey ....................... 235/454

* cited by examiner

Primary Examiner—John F. Niebling
Assistant Examiner—Andre C Stevenson
(74) Attorney, Agent, or Firm—Winstead Sechrest & Minick P.C.

(57) ABSTRACT

A method and system for synchronizing a laser marking device with a lead scanner is disclosed. The laser marking device includes an unloader coupled to the lead scanner and is for marking each of a plurality of semiconductor packages including a plurality of leads. The lead scanner performs a test on the plurality of leads for the plurality of semiconductor packages. The unloader is for containing a portion of the plurality of semiconductor packages that passed the test. The method and system include providing an input receiving circuit, a reset circuit and an output relay. The input receiving circuit is coupled with the unloader and is for receiving an indication of a particular number of the plurality of semiconductor packages received by the unloader. The reset circuit is coupled with the lead scanner and the input receiving circuit and is capable of generating at least one reset signal for resetting the lead scanner in response to the particular number of the plurality of semiconductor packages being reached. The output relay is coupled with the lead scanner and the reset circuit. The output relay is for temporarily precluding the lead scanner from providing a semiconductor package to the unloader.

5 Claims, 4 Drawing Sheets

METHOD AND SYSTEM FOR SYNCHRONIZING LEAD SCANNERS AND LASER MARKER MODULES

FIELD OF THE INVENTION

The present invention relates to processing of semiconductor devices, and more particularly to a system and method for improving the performance of machines used in providing semiconductor packages.

BACKGROUND OF THE INVENTION

During processing of semiconductor devices, the semiconductor device, or package, is typically marked and tested. During processing, a laser marking module and a lead scanner are typically sued. The laser marking module and the lead scanner are generally integrated. The lead scanner can be an ATS300 lead scanner. The mark module includes a marking station where the semiconductor packages are marked and an unloader. The unloader includes a good bin and a reject bin. Coupled to the marking station is the lead scanner. The lead scanner is coupled between the marking station and the unloader. After the semiconductor packages have been marked by the marking station, the lead scanner tests the marked semiconductor packages to determine whether the leads function properly.

The semiconductor packages are provided from the lead scanner to the unloader. Based on the outcome of the test(s) performed by the lead scanner, a particular semiconductor package may be provided to one of the bins in the unloader. If the semiconductor package has passed the test(s) performed by the lead scanner, then the semiconductor package is provided to the good bin. The good bin includes a receptacle to contain the good semiconductor packages which have passed the inspection by the lead scanner. Otherwise, the semiconductor package is provided to the reject bin. Thus, semiconductor packages which do not pass inspection by the lead scanner can be discarded.

Although the laser marking module and lead scanner can function together to mark and test semiconductor packages, one of ordinary skill in the art will readily realize that jams between the lead scanner and laser marking module often occur. The lead scanner includes a counter and switches for controlling the lead scanner. The counter counts the number of semiconductor packages that have been provided from the lead scanner. Similarly, the good bin of the unloader includes a counter for counting the number of good semiconductor packages received. Thus, the counter for the lead scanner can count a different number than the counter for the unloader. This is because the counter for the lead scanner counts each package exiting the lead scanner, while the counter for the good bin only counts the semiconductor packages which are provided to the good bit. Typically, both the counter and the counter count backwards from a particular, user set number. Each of these numbers can be manually set.

For example, suppose that the counter for the lead scanner is set to twenty units per receptacle. Similarly, suppose that the counter for the good bin is set to twenty units. Each time a semiconductor package is released by the lead scanner to either the good bin or the reject bin, the counter for the lead scanner decrements. Thus, for every semiconductor package tested by the lead scanner, the counter for the lead scanner decrements. The counter for the good bin decrements each time the good bin receives a semiconductor package that has passed the tests performed by the lead scanner. However, the counter for the good bin does not change when a semiconductor package is rejected and placed in the reject bin.

Because the counters for the good bin and the lead scanner count different semiconductor packages (only semiconductor packages passing the test versus all semiconductor packages), the counter for the good bin can reach zero when the counter for the lead scanner is nonzero. When the counter for the good bin reaches zero, the marking module pauses to change the receptacles in the good bin. However, the lead scanner continues to attempt to provide another semiconductor package to the good bin. Because semiconductor packages are provided to the unloader when the unloader is changing the receptacle in the good bin, a jam will occur. At this time, production may be halted and the efficiency of the lead scanner and marking module adversely affected. In particular, the yield for the laser marking module and lead scanner combination is reduced.

Accordingly, what is needed is a system and method for preventing jams between the unloader and the lead scanner. The present invention addresses such a need.

SUMMARY OF THE INVENTION

The present invention provides a method and system for synchronizing a laser marking device with a lead scanner. The laser marking device includes an unloader coupled to the lead scanner and is for marking each of a plurality of semiconductor packages including a plurality of leads. The lead scanner performs a test on the plurality of leads for the plurality of semiconductor packages. The unloader is for containing a portion of the plurality of semiconductor packages that passed the test. The method and system comprise providing an input receiving circuit, a reset circuit and an output relay. The input receiving circuit is coupled with the unloader and is for receiving an indication of a particular number of the plurality of semiconductor packages received by the unloader. The reset circuit is coupled with the lead scanner and the input receiving circuit and is capable of generating at least one reset signal for resetting the lead scanner in response to the particular number of the plurality of semiconductor packages being reached. The output relay is coupled with the lead scanner and the reset circuit. The output relay is for temporarily precluding the lead scanner from providing a semiconductor package to the unloader.

According to the system and method disclosed herein, the present invention provides a mechanism for improving the performance of the lead scanner and laser marking device.

DETAILED DESCRIPTION OF THE INVENTION

The present invention relates to an improvement in production of semiconductor devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for synchronizing a laser marking device with a lead scanner. The laser marking device includes an unloader coupled to the lead scanner and is for marking each of a plurality of semiconductor packages including a plurality of leads. The lead scanner performs a test on the plurality of leads for the plurality of semiconductor packages. The unloader is for containing a portion of the plurality of semiconductor packages that passed the test. The method and system comprise providing an input receiving circuit, a reset circuit and an output relay. The input receiving circuit is coupled with the unloader and is for receiving an indication of a particular number of the plurality of semiconductor packages received by the unloader. The reset circuit is coupled with the lead scanner and the input receiving circuit and is capable of generating at least one reset signal for resetting the lead scanner in response to the particular number of the plurality of semiconductor packages being reached. The output relay is coupled with the lead scanner and the reset circuit. The output relay is for temporarily precluding the lead scanner from providing a semiconductor package to the unloader.

The present invention is described in the context of particular laser marking modules and lead scanners. However, one of ordinary skill in the art will readily recognize that the present invention will function with other laser marking modules and other lead scanners. In addition, the present invention is described in the context of specific electronic components. However, one of ordinary skill in the art will readily recognize that other electronics components could be used.

Figure 1:
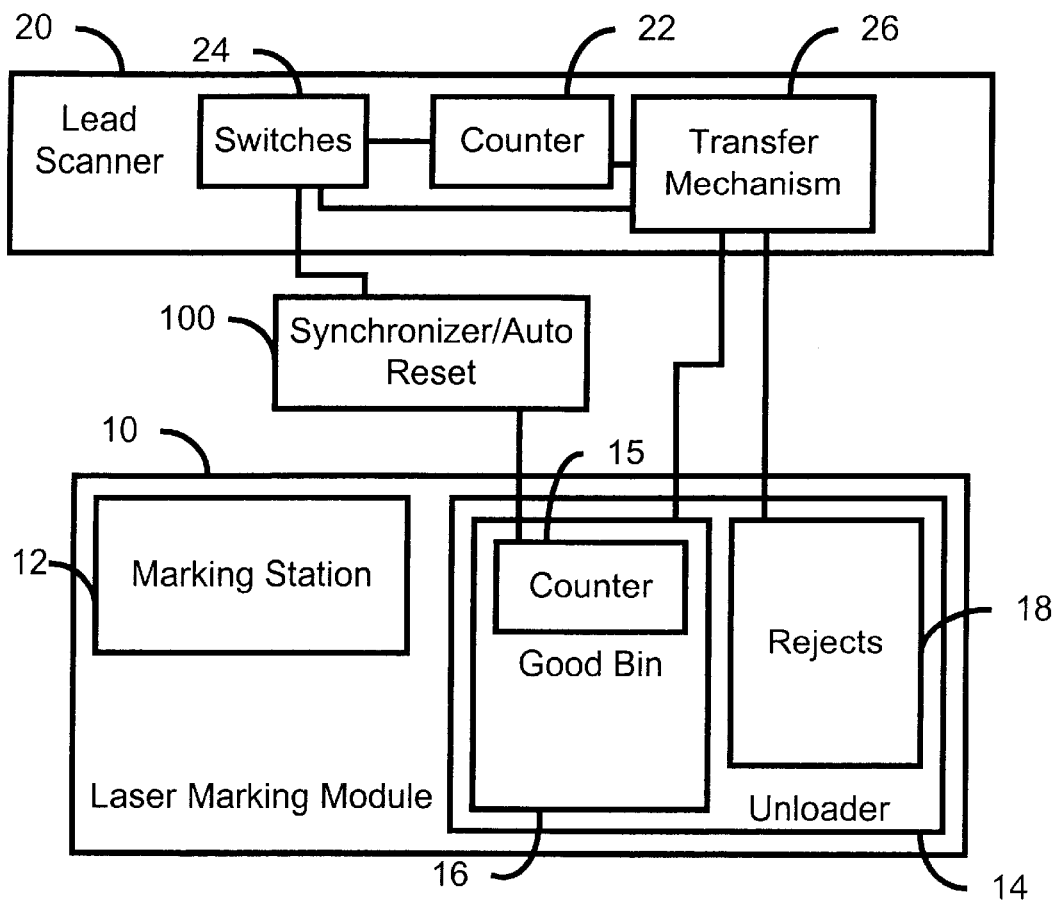
FIG. 1 is a block diagram of one embodiment of the system for synchronizing a laser marking module and a lead scanner in accordance with the present invention in the environment in which it is used.

To more particularly illustrate the method and system in accordance with the present invention, refer now to FIG. 1, depicting one embodiment of a system 100 in accordance with the present invention as utilized with a laser marking module 10 and a lead scanner 20. The laser marking module 10 and lead scanner 20 are generally integrated. The lead scanner 20 is preferably an ATS300 lead scanner. The mark module includes a marking station 12, where the semiconductor packages are marked and an unloader 14. The unloader 14 includes a good bin 16 and a reject receptacle 18. Coupled to the marking station 12 is the lead scanner 20. After the semiconductor packages have been marked by the marking station 12, the lead scanner 20 tests the marked semiconductor packages to determine whether the leads should function properly.

The semiconductor packages are provided from the lead scanner 20 to the unloader 14, which is part of the laser mark module 10. Based on the outcome of the test(s) performed by the lead scanner 20, a particular semiconductor package may be provided to one of the bins 16 and 18 in the unloader 14. If the semiconductor package has passed the test(s) performed by the lead scanner 20, then the semiconductor package is provided to the good bin 16. The good bin 16 includes a receptacle (not explicitly shown) to contain the good semiconductor packages which have passed the inspection by the lead scanner 20. The receptacle is preferably a tube. Otherwise, the semiconductor package is provided to the reject bin 18. Thus, semiconductor packages which do not pass inspection by the lead scanner 20 can be discarded. When the receptacle in the good bin 16 is full, the receptacle is changed for an empty one.

Figure 2:
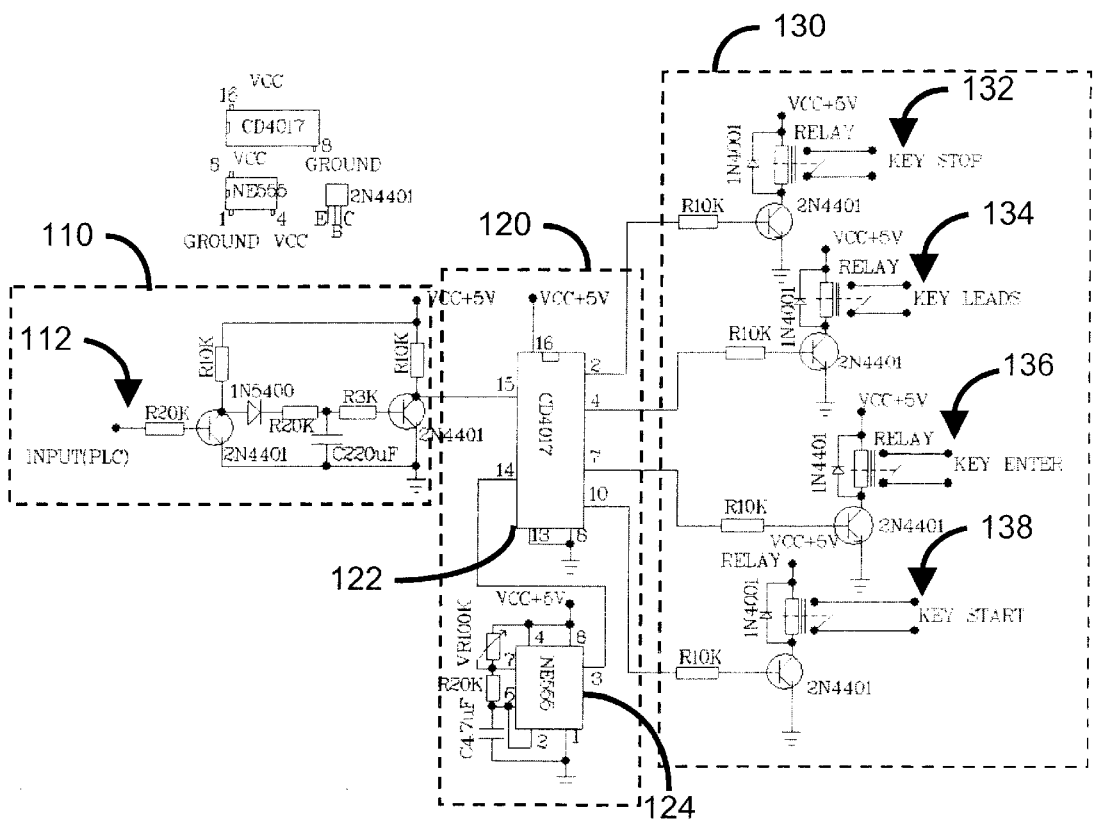
FIG. 2 is a more detailed block diagram of one embodiment of a system for synchronizing a laser marking module and a lead scanner in accordance with the present invention.

The unloader 14 includes a counter 15 for the good bin 16. The counter 15 counts the number of semiconductor packages that have been provided to the good bin. When the counter 15 indicates that a certain number of semiconductor packages have been received by the good bin 16 of the unloader 14, the receptacle is changed. Similarly, the lead scanner 20 includes a counter 22, switches 24 and a transfer mechanism 26. The counter 22 indicates the number of semiconductor packages, both good packages and rejects, that have been tested by the lead scanner 20. The switches 24 control the feeding of semiconductor packages that have been tested to the unloader 14. The transfer mechanism 26 actually transfers the semiconductor packages tested to the unloader 14. Thus, the switches 24 control the transfer mechanism 26. In a preferred embodiment, one or more of the switches 24 also controls the counter 22. Preferably, the counters 15 and 22 are set to a particular value, such as twenty. The counters 15 and 22 then preferably count down as acceptable semiconductor packages are provided to the good bin 16 of the unloader 14 and as all semiconductor packages are provided from the lead scanner 20, respectively. When the counter 15 reaches zero, The system 100 in accordance with the present invention is coupled with the laser marking module 10 and with the lead scanner 20. In particular, the system 100 is coupled with the marking station 12, with the unloader 14 and with the lead scanner 20. The system 100 synchronizes the laser marking module 10 with the lead scanner 20. Thus, the system 100 ensures that the lead scanner 20 does not provide additional semiconductor packages to the unloader 14 while the unloader is unable to receive semiconductor packages because the receptacle in the good bin 16 is being changed. In addition, the system 100 synchronizes the counters 15 and 22 so that the counters 15 and 22 commence at the same point after the unloader 14 has exchanged a full receptacle in the good bin 16 for a new receptacle. Thus, the system 100 preferably resets the counters 15 and 22 to the same number after the good bin 16 is provided with a new receptacle FIG. 2 depicts a more detailed block diagram of one embodiment of a system 100 in accordance with the present invention for synchronizing the lead scanner 20 with the laser marking module 10. The system 100 includes an input receiving circuit 110, a reset circuit 120 and an output relay circuit 130. The input receiving circuit 110 is coupled with the unloader 14 and receives an indication that a particular number of semiconductor packages have been received by the good bin 16 of the unloader 14. In a preferred embodiment, the input receiving circuit 110 receives an input from line 112 from the counter 15 that indicates that the counter 15 has reached zero, indicating that the receptacle for the good bin 16 is to be changed.

The reset circuit 120 is coupled with the lead scanner, preferably via the output relay circuit 130. The reset circuit 120 is also coupled with the input receiving circuit 110. The reset circuit 120 generates a signal for resetting the lead scanner 20 in response to the input receiving circuit 110 receiving the input from the unloader 14. The reset circuit 120 includes a counter 122 and a clock generator 124. The clock generator 124 provides a clock signal for use by the counter 122, which is preferably a decade counter. The counter 122 processes the processes the signals used in resetting the lead scanner 20.

The output relay circuit 130 is coupled with the lead scanner 20 and the reset circuit 120. The output relay circuit 130 is for temporarily precluding the lead scanner 20 from providing any semiconductor packages to the unloader 14 and for resetting the counter 22 of the lead scanner 20. The output relay circuit 130 includes outputs 132, 134, 136 and 138 for controlling switches 24 for the counter 22 and the transfer mechanism 26. Thus, the counter 22 can be reset, for example to a value of twenty.

Figure 3:
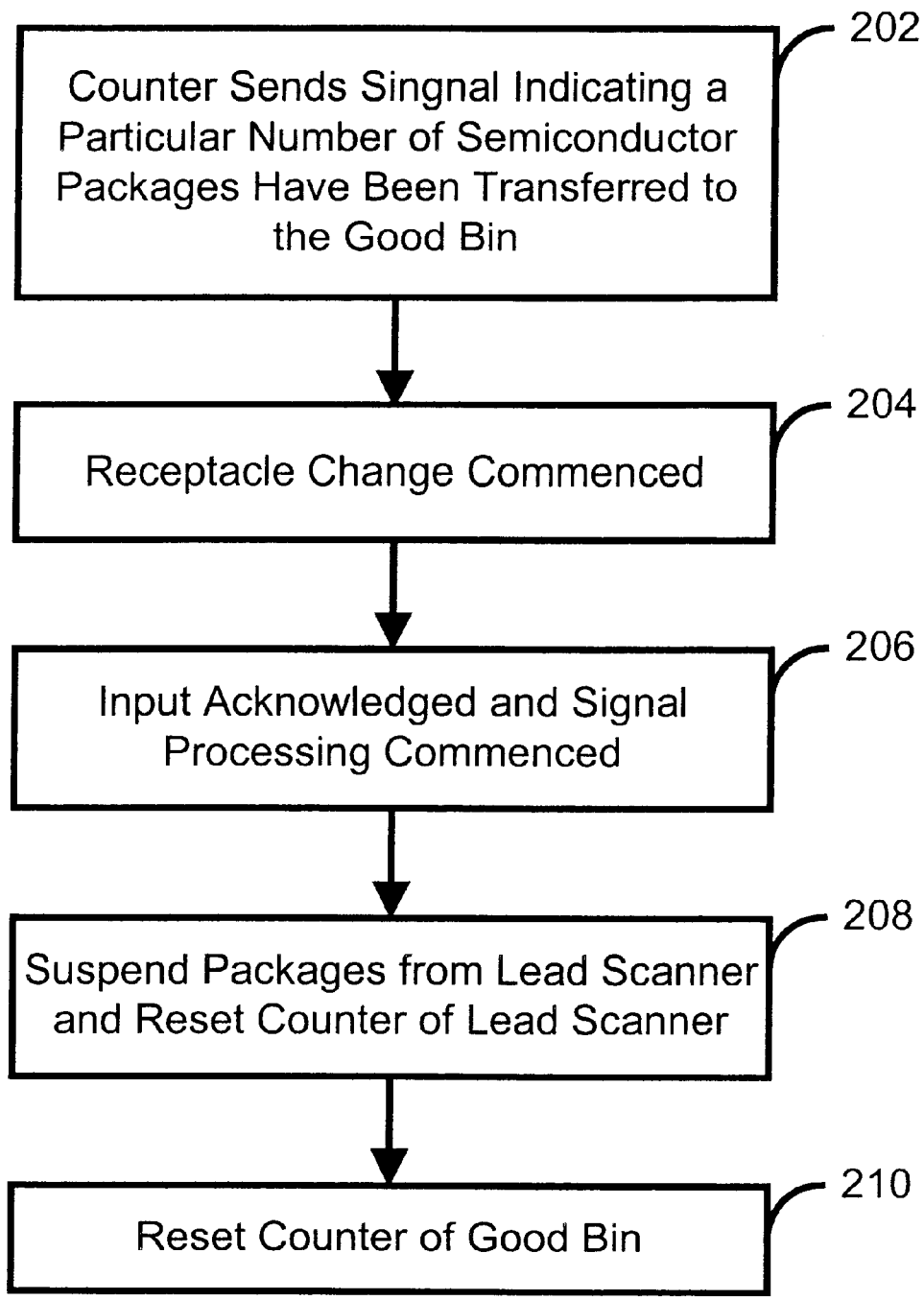
FIG. 3 is a flow chart depicting one embodiment of a method for synchronizing a laser marking module and a lead scanner in accordance with the present invention.

FIG. 3 depicts one embodiment of a method 200 for using the system 100 for synchronizing the laser marking module 10 with the unloader 20. The method 200 will be described in conjunction with the system 100 and the laser marking module 10 and lead scanner 20 depicted in FIGS. 1 and 2. The method 200 also includes some steps performed only by the laser marking module 10 or the lead scanner 20 in order to fully explain the present invention. The counter 15 sends a signal to the system 100 indicating that a particular number of acceptable semiconductor packages have been transferred to the good bin 16, via step 202. Preferably, step 202 is accomplished by the input receiving circuit 110 receiving a signal that the counter 15 has reached zero. The changing of the receptacle for the good bin 16 is commenced by the laser marking module 10, via step 204. The reset circuit 120 acknowledges the input and commences processing of the signals to be provided to the lead scanner 20, via step 206. In response to signals provided from the reset circuit 120, the output relay circuit 130 temporarily suspends semiconductor packages from being fed from the lead scanner 20 to the unloader 14 and resets the counter 22 for the lead scanner, via step 208. Thus, step 208 prevents semiconductor packages from being provided to the good bin 16 while the receptacle is being changed. The counter 15 for the good bin 16 is also reset by the laser marking module 10, via step 210. The counters 22 and 15 are preferably reset to the same number in steps 208 and 210.

Using the system 100 and method 200, the counters 15 and 22 are reset so that they are synchronized. In addition, the lead scanner 20 is precluded from providing semiconductor packages to the good bin 16 while the receptacle for the good bin is being changed. As a result, jams between the lead scanner 20 and unloader 14 of the laser marking module 10 can be reduced or eliminated. Consequently, the yield for the laser marking module 10 and lead scanner 20 is improved. The time required to mark and test semiconductor packages may also be reduced. Furthermore, the system 100 is relatively compact, inexpensive and easy to set up. Thus, the benefits of synchronizing the lead scanner 20 and laser marking module 10 can be relatively easily obtained.

Figure 4:
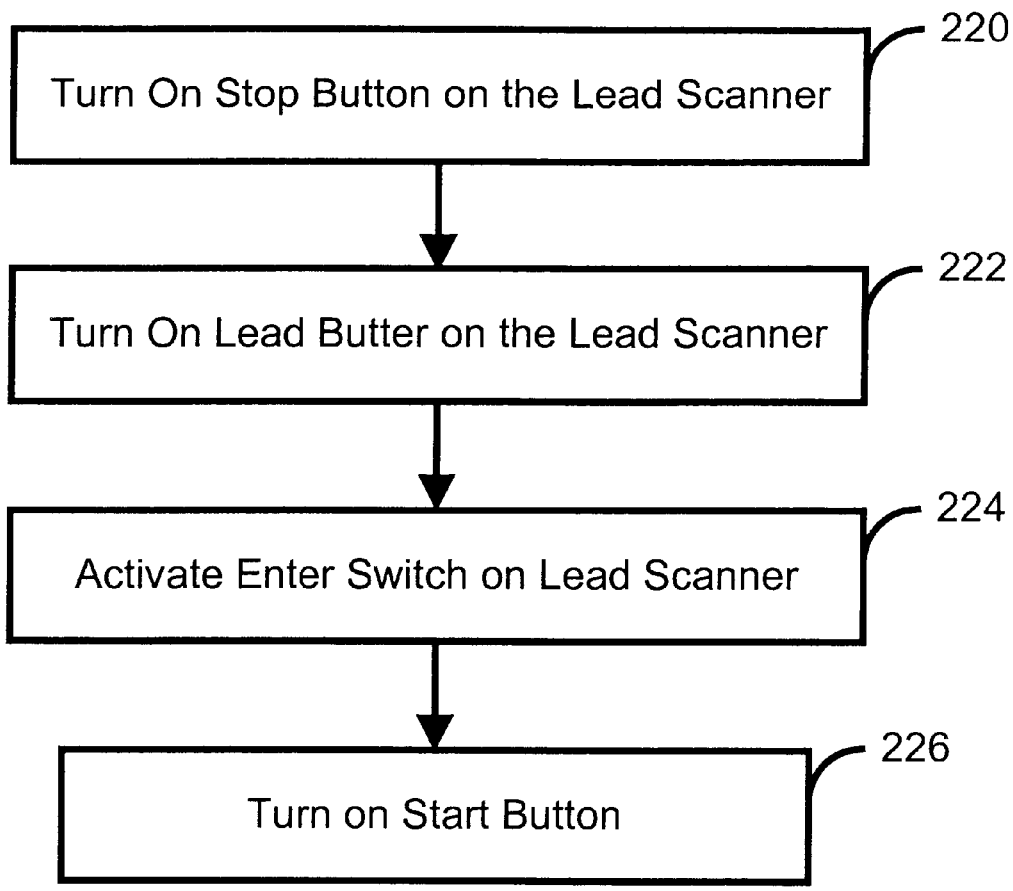
FIG. 4 is a flow chart depicting one embodiment of a method for controlling the lead scanner in accordance with the present invention.

FIG. 4 depicts one embodiment of a method for using the output relay circuit 130 to temporarily suspend semiconductor packages from being fed from the lead scanner 20 to the unloader 14 and to reset the counter 22 for the lead scanner as in step 208. The output relay circuit 130 turns on the "stop button" for the lead scanner 20 using the key stop output 132, via step 220. This prevents the lead scanner 20 from transferring semiconductor packages to the unloader 14. The lead button of the lead scanner 20 is then turned on using the key leads output 134, via step 222. This allows the lead scanner 20 to refer to the preset number of units for processing. The enter switch of the lead scanner 20 is activated using the key enter output 136 of the output relay circuit 130, via step 224. Step 224 executes the new preset number of units for processing. Thus, if the counter 22 is to be reset to twenty units, step 224 ensures that the counter 22 is reset to twenty. The start button of the lead scanner 20 is then turned on using the key start output 138 of the output relay circuit, via step 226. Step 226 allows the lead scanner 20 to commence transferring semiconductor packages to the unloader again. Step 226 is performed after the unloader 14 has exchanged a full receptacle in the good bin 16 for an empty receptacle. Thus, as described above, the system 100 can prevent the lead scanner 20 from transferring semiconductor packages to the unloader 14 while the receptacle in the good bin 16 is being changed. In addition, the counter 22 is reset, preferably to match the counter 15 of the good bin. As a result, jams can be prevented.

A method and system has been disclosed for synchronizing an unloader of a laser marking module and a lead scanner. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for synchronizing a laser marking device with a lead scanner, the laser marking device including an unloader coupled to the lead scanner, the laser marking device for marking each of a plurality of semiconductor packages including a plurality of leads, the lead scanner for performing a test of the plurality of leads for the plurality of semiconductor packages, the unloader for containing a portion of the plurality of semiconductor packages, the portion of the plurality of semiconductor packages having passed the test, the system comprising:

an input receiving circuit, coupled with the unloader, for receiving an indication of a particular number of the plurality of semiconductor packages received by the unloader;

a reset circuit, coupled with the lead scanner and the input receiving circuit, capable of generating at least one reset signal for resetting the lead scanner in response to the particular number of the plurality of semiconductor packages being reached; and an output relay, coupled with the lead scanner and the reset circuit, for temporarily precluding the lead scanner from providing a semiconductor package to the unloader.

2. The system of claim 1 wherein the lead scanner includes a counter and wherein the reset circuit includes a clock generator and a counter coupled to the clock generator, the clock generator providing a clock signal to the counter, the counter providing a reset signal to the counter of the lead scanner.

3. A system for synchronizing a laser marking device with a lead scanner, the laser marking device including an unloader coupled to the lead scanner, the laser marking device for marking each of a plurality of semiconductor packages including a plurality of leads, the lead scanner for performing a test of the plurality of leads for the plurality of semiconductor packages, the unloader for containing a portion of the plurality of semiconductor packages, the portion of the plurality of semiconductor packages having passed the test, the system comprising:

an input receiving circuit, coupled with the unloader, for receiving an indication of a particular number of the plurality of semiconductor packages received by the unloader;

a reset circuit, coupled with the lead scanner and the input receiving circuit, capable of generating at least one reset signal for resetting the lead scanner in response to the particular number of the plurality of semiconductor packages being reached; and an output relay, coupled with the lead scanner and the reset circuit, for temporarily precluding the lead scanner from providing a semiconductor package to the unloader;

wherein the lead scanner includes a transfer mechanism for transferring the plurality of packages to the unloader and a plurality of switches for controlling the transfer mechanism, and wherein the output relay controls the plurality of switches to ensure that the transfer mechanisms provides no semiconductor package to the unloader for a particular time.

4. A system for synchronizing a laser marking device with a lead scanner, the laser marking device including an unloader coupled to the lead scanner, the laser marking device for marking each of a plurality of semiconductor packages including a plurality of leads, the lead scanner for performing a test of the plurality of leads for the plurality of semiconductor packages, the unloader for containing a portion of the plurality of semiconductor packages, the portion of the plurality of semiconductor packages having passed the test, the system comprising:

an input receiving circuit, coupled with the unloader, for receiving an indication of a particular number of the plurality of semiconductor packages received by the unloader;

a reset circuit, coupled with the lead scanner and the input receiving circuit, capable of generating at least one reset signal for resetting the lead scanner in response to the particular number of the plurality of semiconductor packages being reached; and an output relay, coupled with the lead scanner and the reset circuit, for temporarily precluding the lead scanner from providing a semiconductor package to the unloader;

wherein the particular number is the particular number of good semiconductor packages of the plurality of semiconductor packages and wherein the unloader releases the plurality of good semiconductor packages when the particular number is reached.

5. The system of claim 1 wherein the particular number is indicated by a counter reaching zero.

* * * * *